US008941156B2

(12) United States Patent
Bergendahl et al.

(10) Patent No.: US 8,941,156 B2
(45) Date of Patent: Jan. 27, 2015

(54) SELF-ALIGNED DIELECTRIC ISOLATION FOR FINFET DEVICES

(71) Applicants: International Business Machines Corporation, Armonk, NY (US); GlobalFoundries, Inc., Grand Cayman Islands (KY)

(72) Inventors: Marc Adam Bergendahl, Hopewell Junction, NY (US); Kangguo Cheng, Schenectady, NY (US); David Vaclav Horak, Essex Junction, VT (US); Ali Khakifirooz, Mountain View, CA (US); Shom Ponoth, Gaitherburg, MD (US); Theodorus Eduardus Standaert, Clifton Park, NY (US); Chih-Chao Yang, Glenmont, NY (US); Charles William Koburger, III, Delmar, NY (US); Xiuyu Cai, Niskayuna, NY (US); Ruilong Xie, Schenectady, NY (US)

(73) Assignees: International Business Machines Corporation, Armonk, NY (US); GlobalFoundries, Inc., Ugland House (KY)

( * ) Notice: Subject to any disclaimer, the term of this patent is extended or adjusted under 35 U.S.C. 154(b) by 73 days.

(21) Appl. No.: 13/735,315

(22) Filed: Jan. 7, 2013

(65) Prior Publication Data
US 2014/0191296 A1 Jul. 10, 2014

(51) Int. Cl.
H01L 29/78 (2006.01)

(52) U.S. Cl.
CPC .... *H01L 29/7855* (2013.01); *H01L 29/664848* (2013.01)
USPC ........... 257/288; 438/157; 438/199; 438/283; 438/300; 438/438

(58) Field of Classification Search
USPC .......................... 257/288, 369, 368, 328, 338
See application file for complete search history.

(56) References Cited

U.S. PATENT DOCUMENTS

| 2008/0299734 A1 | 12/2008 | Lee et al. |
| 2009/0078997 A1* | 3/2009 | Greene et al. ................. 257/347 |
| 2012/0025316 A1 | 2/2012 | Schultz |

* cited by examiner

*Primary Examiner* — Chuong A Luu
*Assistant Examiner* — Rodolfo Fortich
(74) *Attorney, Agent, or Firm* — Yuanmin Cai

(57) ABSTRACT

Embodiments of the present invention provide a method of forming semiconductor structure. The method includes forming a set of device features on top of a substrate; forming a first dielectric layer directly on top of the set of device features and on top of the substrate, thereby creating a height profile of the first dielectric layer measured from a top surface of the substrate, the height profile being associated with a pattern of an insulating structure that fully surrounds the set of device features; and forming a second dielectric layer in areas that are defined by the pattern to create the insulating structure. A structure formed by the method is also disclosed.

16 Claims, 10 Drawing Sheets

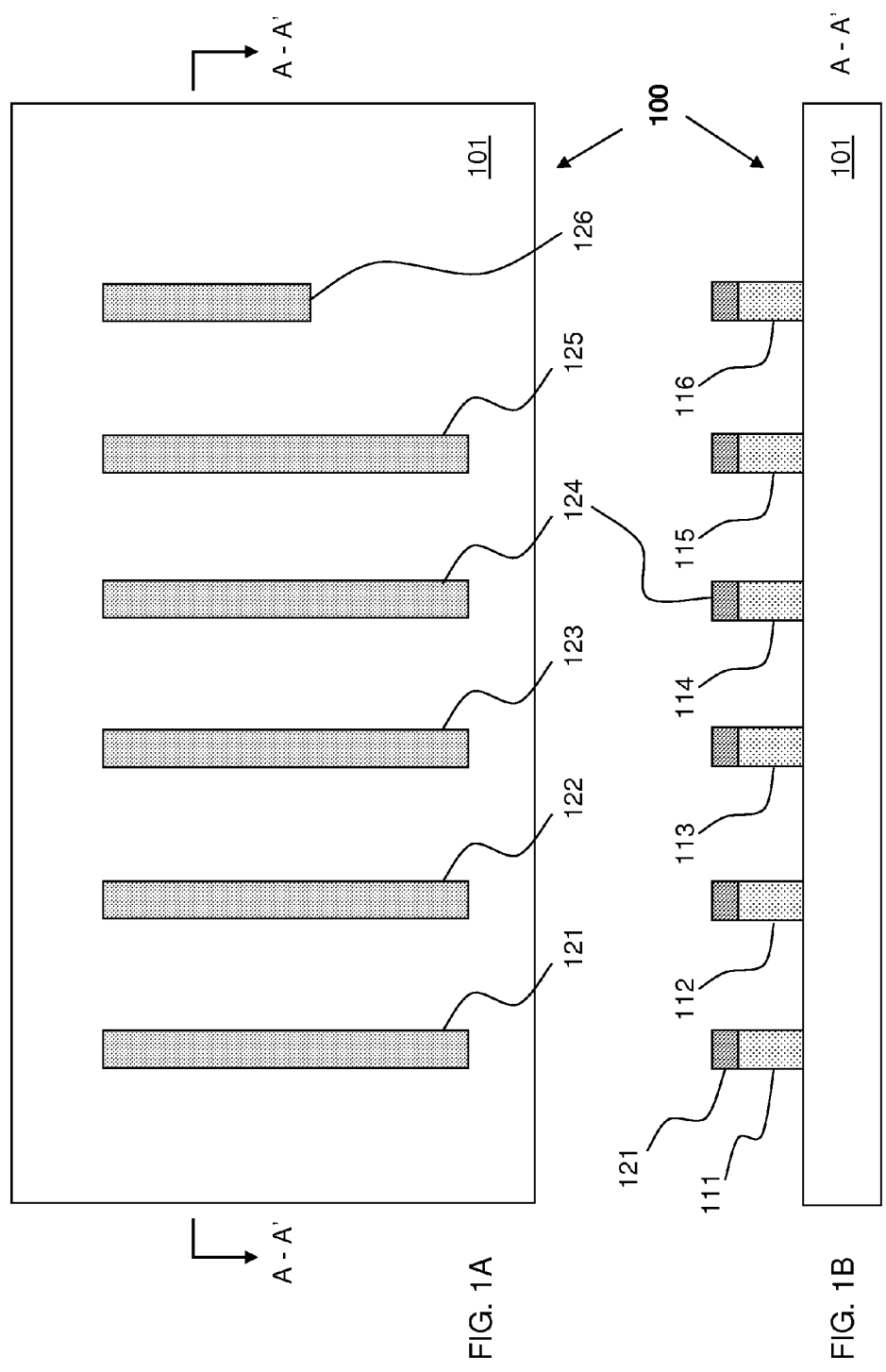

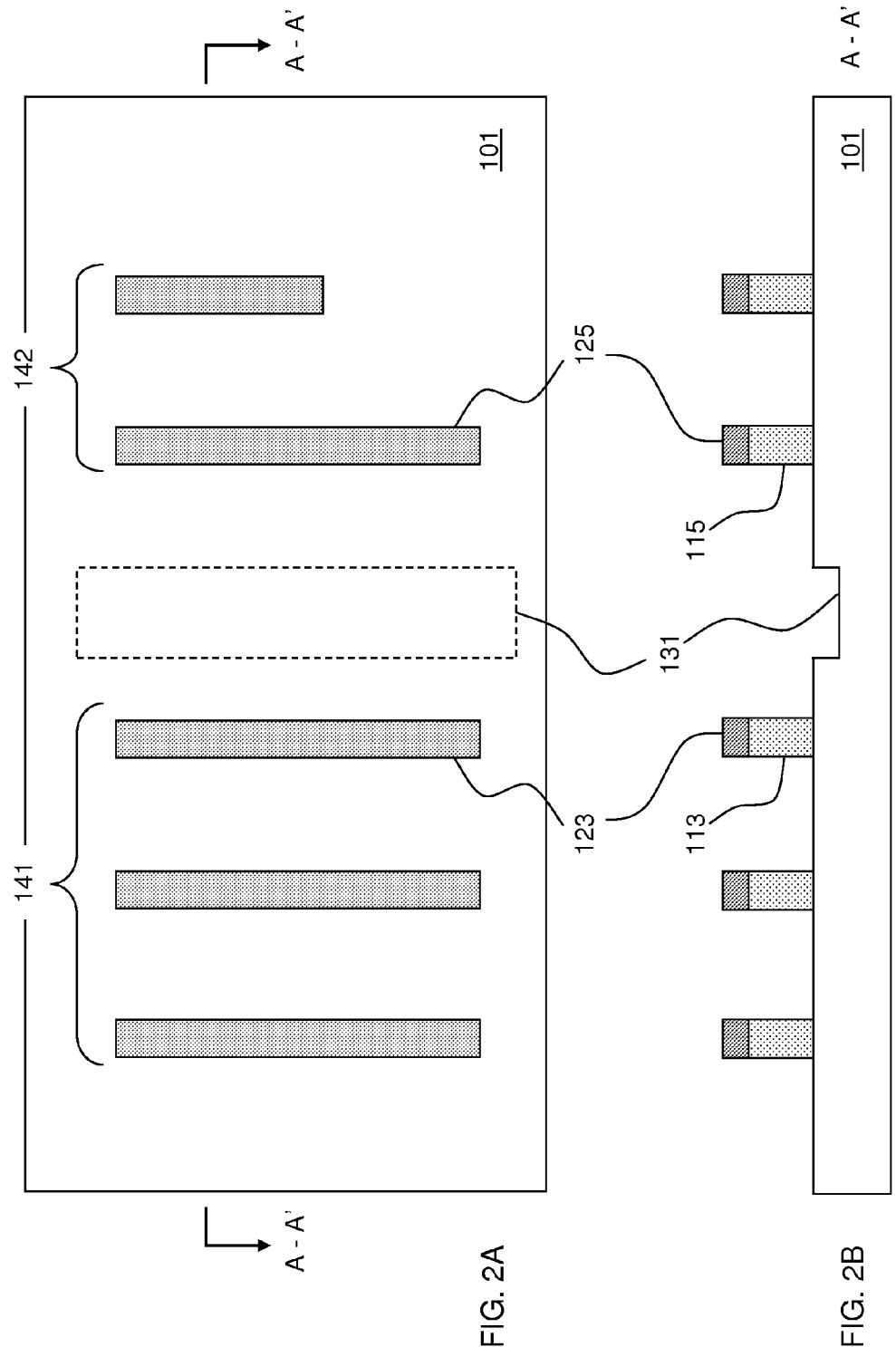

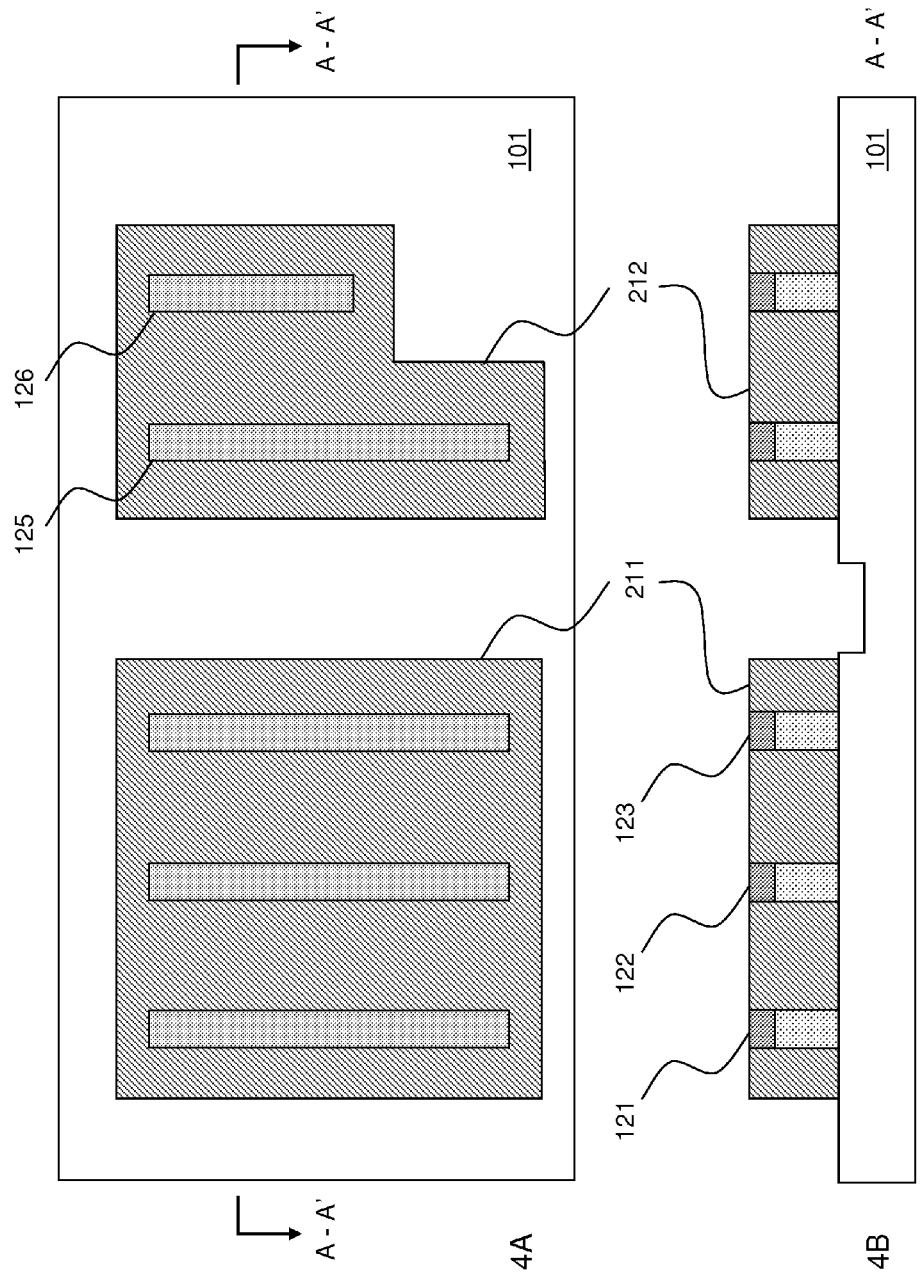

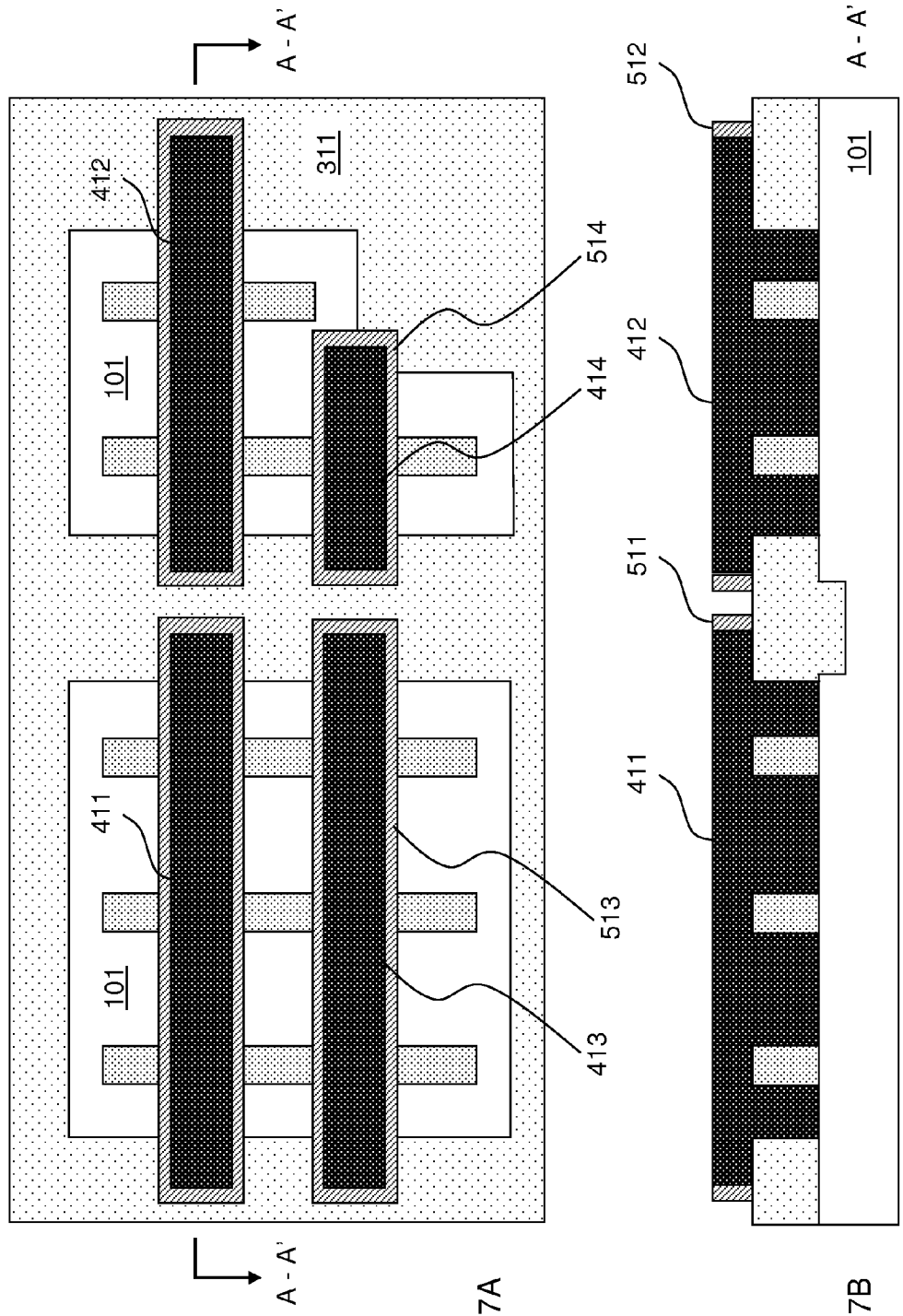

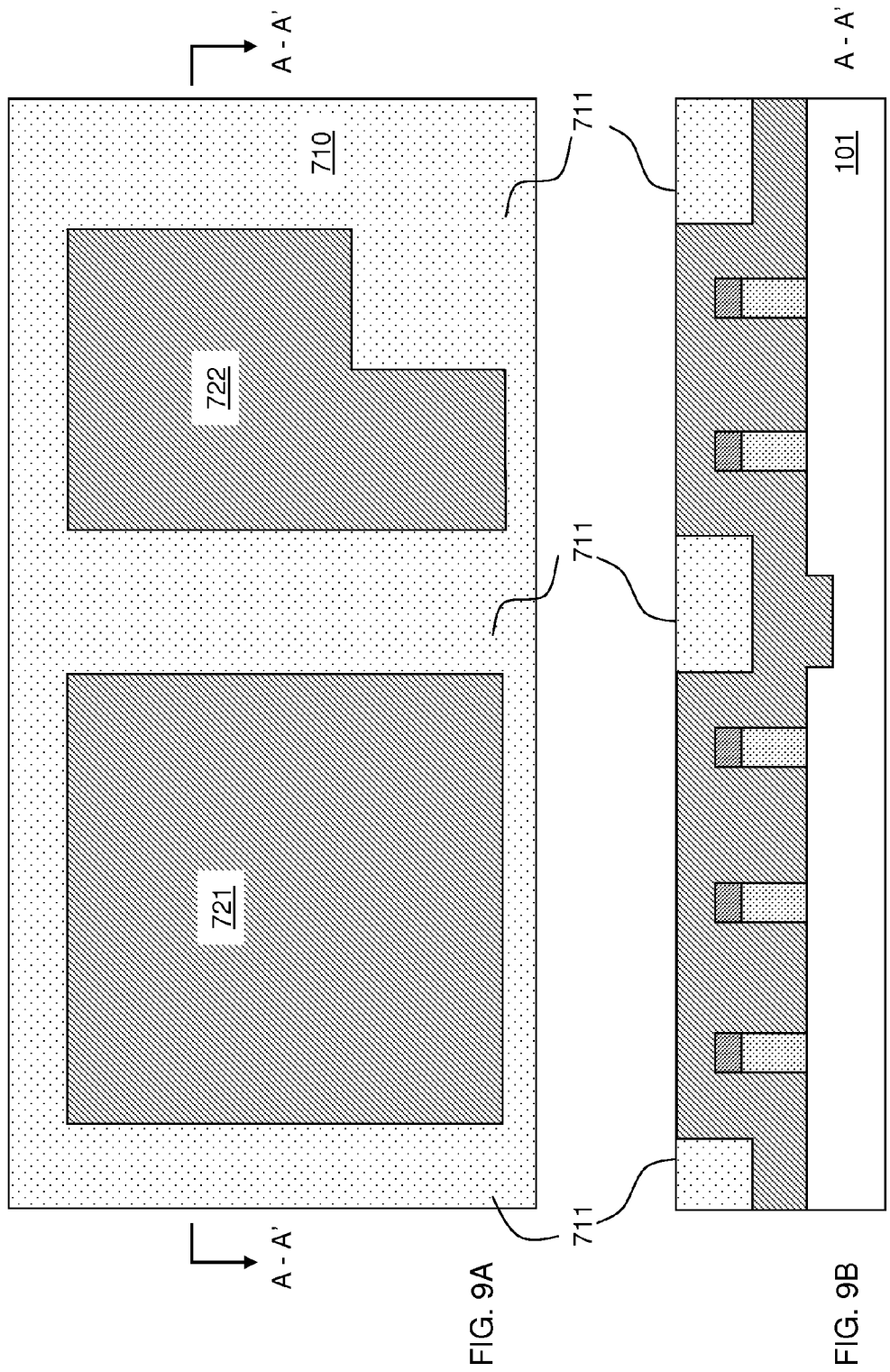

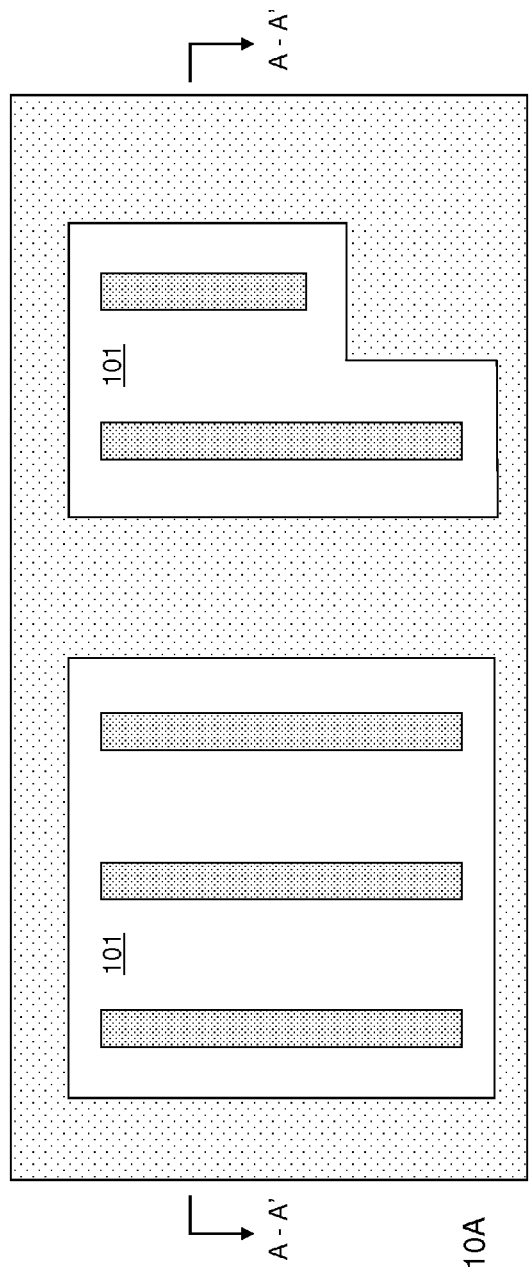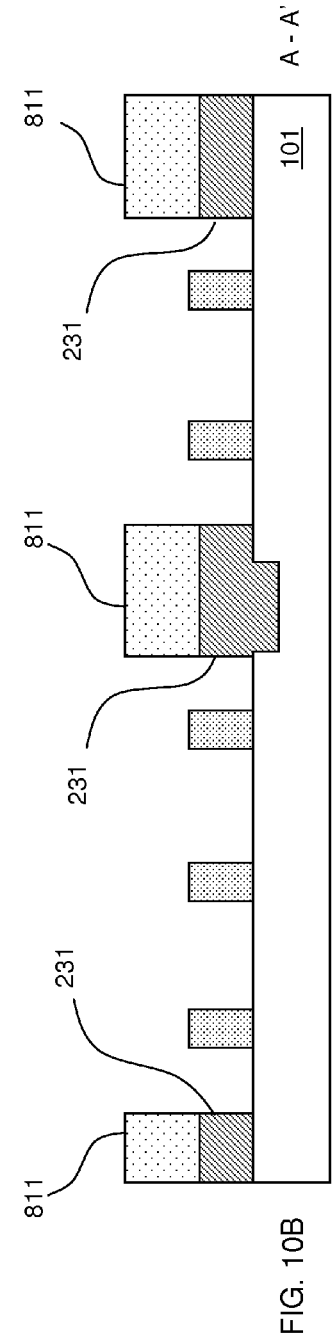

SELF-ALIGNED DIELECTRIC ISOLATION FOR FINFET DEVICES

FIELD OF THE INVENTION

The present invention relates generally to the field of semiconductor device manufacturing and in particular relates to method of forming self-aligned isolation surrounding FinFET transistors.

BACKGROUND OF THE INVENTION

With recent advancement in semiconductor device manufacturing, and in particular with regard to fin-type field-effect-transistors (FinFETs), epitaxially formed source/drain is increasingly becoming preferred and may even be inevitable in order to provide low resistance contacts to the FinFETs and other devices, such as nanowires, that involve the use of epitaxial processes. A merged epitaxy process is typically used in forming epitaxial source/drain for FinFET transistors. However, merged epitaxy process also mandates several ground rules which could potentially lead to area penalties such as loss of real estate in a semiconductor chip. For example, with current FinFET manufacturing technology, dummy fins are generally needed to be strategically placed between every two transistors, and a gate is generally required to extend past fins for a certain length in order to avoid source/drain (S/D) short due to possible epitaxial roundabout. In addition, fins need to be tucked under dummy gate in order to avoid extensive epitaxial growth at free ends of the fins.

Several processes have been proposed recently to relax these requirements on ground rules. For example, it has been proposed to oxidize dummy fins as opposed to remove them. However, concerns still remain as to potential oxygen diffusion through the bulk oxide (BOX) and affecting active fins. Another approach is to use shallow trench isolation (STI) that extrudes out. However, the STI made by the above process is not self-aligned to the fins. For example, the width and location of STI is usually defined by a mask, which may not necessarily be aligned with the fins.

SUMMARY OF EMBODIMENTS OF THE INVENTION

Embodiments of the present invention provide a method of form a semiconductor structure, and in particular an insulating structure surrounding a set of fins of one or more fin-type field-effect-transistors (FinFETs). The method includes forming a set of device features on top of a substrate; forming a first dielectric layer directly on top of the set of device features and on top of the substrate thereby creating a height profile of the first dielectric layer measured from a top surface of the substrate, the height profile being associated with a pattern of an insulating structure that fully surrounds the set of device features; and forming a second dielectric layer in areas that are defined by the pattern to create the insulating structure.

According to one embodiment, the method further includes, before forming the second dielectric layer, removing a portion of the first dielectric layer to form sidewall spacers next to sidewalls of at least some of the set of device features and to expose portions of the substrate that are defined by the pattern of the insulating structure.

In one embodiment, the set of device features includes at least a first group of device features and a second group of device features, and wherein forming the first dielectric layer includes causing the first dielectric layer to create the pattern of the insulating structure by the height profile, the pattern of the insulating structure separating the first group of device features from the second group of device features in two enclosures.

In another embodiment, forming the first dielectric layer includes depositing a conformal dielectric layer on top of the first group and the second group of device features and on top of the substrate, the conformal dielectric layer having a thickness that is sufficiently thick to fill up any gap between any two neighboring device features either within the first group or within the second group.

In yet another embodiment, forming the first dielectric layer includes depositing a conformal dielectric layer as the first dielectric layer, whose thickness is less than half of the shortest distance between the first and the second groups of device features, creating the height profile that complements a height profile of the insulating structure.

According to another embodiment, the method further includes, before forming the second dielectric layer, directionally etching the first dielectric layer to remove portions of the first dielectric layer that surround the first and second groups of device features to expose the substrate underneath thereof, the directional etching substantially maintains the pattern of the insulating structure.

According to yet another embodiment, the method further includes, after forming the second dielectric layer in areas defined by the pattern directly on top of the exposed substrate, removing portions of the second dielectric layer that are deposited on top of the first dielectric layer and on top of the first and second groups of device features.

In one embodiment, wherein the set of device features is a set of fins of a set of fin-type field-effect-transistors (FinFETs). The method further includes forming a set of gates for the set of FinFETs substantially perpendicular to and across the set of fins, the set of gates having their respective two ends directly on top of the insulating structure. In another embodiment, the method further includes epitaxially forming source and drain of the set of FinFETs from portions of the substrate adjacent to the set of fins.

BRIEF DESCRIPTION OF THE DRAWINGS

The present invention will be understood and appreciated more fully from the following detailed description of preferred embodiments, taken in conjunction with the accompanying drawings of which:

FIGS. 1A and 1B are demonstrative illustrations of top and cross-sectional views of a semiconductor structure during a process of manufacturing thereof according to an embodiment of present invention;

FIGS. 2A and 2B are demonstrative illustrations of top and cross-sectional views of a semiconductor structure during a process of manufacturing thereof, following a step illustrated in FIGS. 1A and 1B, according to an embodiment of present invention;

FIGS. 4A and 4B are demonstrative illustrations of top and cross-sectional views of a semiconductor structure during a process of manufacturing thereof, following a step illustrated in FIGS. 3A and 3B, according to an embodiment of present invention;

FIGS. 7A and 7B are demonstrative illustrations of top and cross-sectional views of a semiconductor structure during a process of manufacturing thereof, following a step illustrated in FIGS. 6A and 6B, according to an embodiment of present invention;

FIGS. 9A and 9B are demonstrative illustrations of top and cross-sectional views of a semiconductor structure during a process of manufacturing thereof, following a step illustrated in FIGS. 3A and 3B, according to another embodiment of present invention; and FIGS. 10A and 10B are demonstrative illustrations of top and cross-sectional views of a semiconductor structure during a process of manufacturing thereof, following a step illustrated in FIGS. 9A and 9B, according to an embodiment of present invention.

Figure 3A:
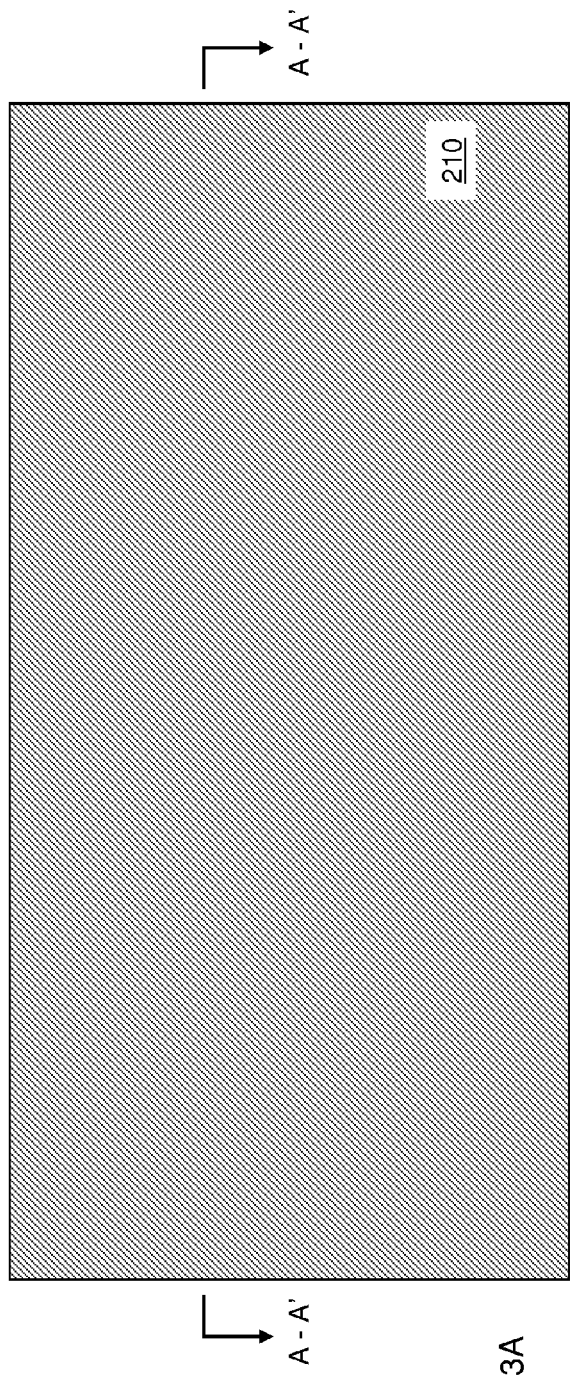
FIGS. 3A and 3B are demonstrative illustrations of top and cross-sectional views of a semiconductor structure during a process of manufacturing thereof, following a step illustrated in FIGS. 2A and 2B, according to an embodiment of present invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIGS. 1A and 1B are demonstrative illustrations of top and cross-sectional views of a semiconductor structure during a process of manufacturing thereof according to an embodiment of present invention. More specifically, the cross-sectional view of FIG. 1B, and following corresponding drawings, is made at a horizontal location as being denoted by A-A' in FIG. 1A.

As will be made more clearly later through additional drawings and their related description, the semiconductor structure in FIGS. 1A and 1B may be part of a semiconductor chip that includes a set of semiconductor devices 100. For example, in one embodiment, the set of semiconductor devices 100 may be a set of fin-type field-effect-transistors (FinFETs). However, embodiment of present invention is not limited in this aspect and other types of semiconductor devices, structures, or features are contemplated here as well.

In making the set of semiconductor devices 100, embodiments of present invention provide a method which may start with providing a semiconductor substrate 101 as being illustrated in FIG. 1A and FIG. 1B. Semiconductor substrate 101 may be a bulk substrate such as Si, Ge, SiGe, Si:C, any of group III-V alloys, or a semiconductor on insulator (SOI) substrate. The method then forms a set of device features 111-116 on top of semiconductor substrate 101. In one embodiment, device features 111-116 may be a set of fins that are used to form one or more FinFET transistors. The set of fins 111-116 may be formed or created through various existing or future developed processes. For example, in one embodiment, a set of hard masks 121-126 may be used in forming the set of fins 111-116, such as being used to cover material underneath thereof in a reactive-ion-etching (RIE) process that transforms the underneath material into the set of fins 111-116. In one embodiment, the set of hard masks 121-126 may remain on top of the set of fins 111-116 after the formation thereof, as being illustrated in FIGS. 1A and 1B. In one embodiment, the set of device features or fins may include a dummy feature or dummy fin 114.

In one embodiment, the set of fins 111-116 may be equally spaced and in some cases, with the advanced scaling in current semiconductor technology, may be narrowly and equally spaced. Moreover, some fin or fins may be made to have a length shorter than others depending upon an overall design of the corresponding FinFETs to be made and how the set of FinFETs are to be interconnected. In the demonstrative example illustrated in FIGS. 1A and 1B, fin 116 may be made to be shorter than other fins 111-115. Further it is to be noted that, as being described below in more details, the set of FinFETs may include one or more groups of FinFETs that are made from one or more groups of fins or, more generally, made from one or more groups of device features.

FIGS. 2A and 2B are demonstrative illustrations of top and cross-sectional views of a semiconductor structure during a process of manufacturing thereof, following a step illustrated in FIGS. 1A and 1B, according to an embodiment of present invention. More specifically, in one embodiment, the set of device features 111-116 may include multiple device feature groups such as, for example, a first group 141 of device features 111-113 and a second group 142 of device features 115-116. Group 141 and group 142 may be separated or divided by device feature 114 which in this embodiment is a dummy device feature. As one embodiment of method in dividing the device features into first and second groups 141 and 142, dummy device feature 114, together with hard mask 124 on top thereof, may be removed or etched away through a selective etching process thereby creating a big spacing between device feature 113 and device feature 115 or, in other words, between first group 141 of device features 111-113 and second group 142 of device features 115-116. As one non-limiting example, the removal of dummy device feature 114 may be made through a standard lithographic patterning and etching process. In one embodiment, the etching of device feature 114 may cause over-etch into substrate 101 resulting in ditches or some imperfections such as 131, as well as some lateral positional variations, as being illustrated in FIGS. 2A and 2B. According to one embodiment of present invention, certain level of imperfections and lateral positional variations may be acceptable, which will be made more clearly in the following description.

Figure 3B:
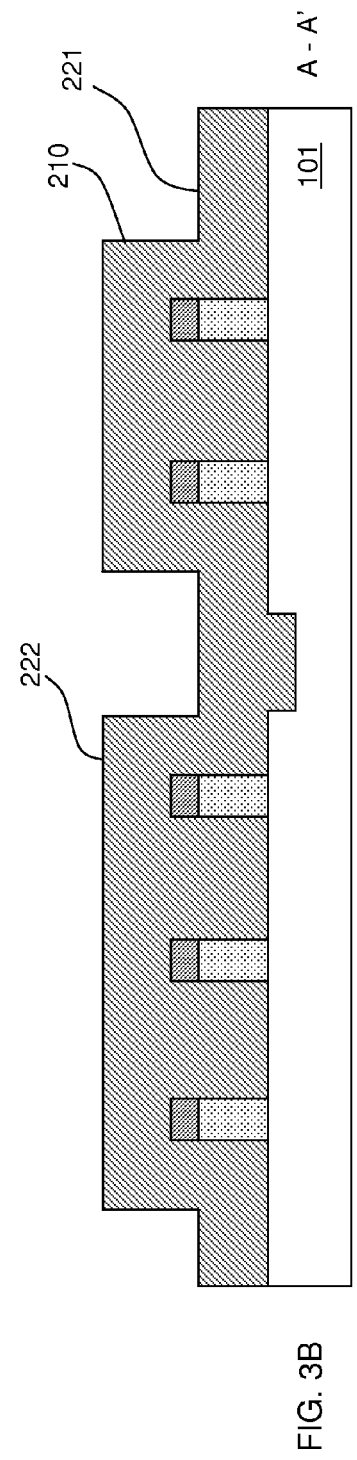

FIGS. 3A and 3B are demonstrative illustrations of top and cross-sectional views of a semiconductor structure during a process of manufacturing thereof, following a step illustrated in FIGS. 2A and 2B, according to an embodiment of present invention. More specifically, according to one embodiment, the method includes applying a dielectric layer 210 covering first group 141 and second group 142 of device features. Dielectric layer 210 may be made of silicon oxide, silicon nitride, a high-k dielectric or any suitable dielectric materials and may be formed by any deposition method known in the art such as CVD, PECVD, or ALD that forms, preferably, a conformal dielectric layer.

In one embodiment, dielectric layer 210 is a first dielectric layer that may be conformally deposited over first group 141 and second group 142 of device features. Moreover, first dielectric layer 210 may have a thickness that is sufficiently thick to fill in gaps or distances between device features within first group 141 and sufficiently thick to fill in gaps or distances between device features within second group 142. In other words, the thickness of dielectric layer 210 is greater than half of a distance between any two neighboring device features in the same group. First dielectric layer 210 may also have a thickness that is less than half of a distance between two neighboring groups such as group 141 and group 142 of device features. In other words, a shortest distance between device features of the first group 141 and device features of the second group 142 is at least twice as big as a thickness of first dielectric layer 210.

According to one embodiment, the deposition of first dielectric layer 210 may create a height profile that represents or defines a pattern of an insulating structure that fully surrounds the device features. More specifically, the first dielectric layer 210 may have two distinctive height levels 221 and 222. The first height level 221 represents a structure that surrounds the first group 141 and second group 142 of device features, and the second height level 222 represents areas where the first group 141 and second group 142 of device features are located. There may be some height variation within each height levels such as, for example, variation caused by imperfection 131. However, the first height level 221 is distinctive from the second height level 222 to have a height that is always lower than that of the second height level 222.

FIGS. 4A and 4B are demonstrative illustrations of top and cross-sectional views of a semiconductor structure during a process of manufacturing thereof, following a step illustrated in FIGS. 3A and 3B, according to an embodiment of present invention. According to one embodiment, the method includes applying a directional etching process to remove a portion of the first dielectric layer 210 such as a first portion thereof. The removal of the first portion of the first dielectric layer 210 may expose substrate 101 in areas that are defined by the pattern of the insulating structure, underneath the first height level 221, while remaining portion of the first dielectric layer 210 stays between device features of the first group 141; between device features of the second group 142; as sidewall spacers in areas immediately surrounding the first group 141; and as sidewall spacers in areas immediately surrounding the second group 142, as being described below in more details.

For example, the removal of the first portion of the first dielectric layer 210 may create a first dielectric area 211 filling in between and surrounding the first group 141 of device features and a second dielectric area 212 filling in between and surrounding the second group 142 of device features. More specifically, in one embodiment, the removal of the first portion of the first dielectric layer 210 in an anisotropic etching process may create sidewall spacers including those, as being demonstratively illustrated in FIG. 4B and usually with rounded edges (now shown), that is next to the left of device feature 111, next to the right of device feature 113, next to the left of device feature 115, and next to the right of device feature 116. In some embodiment, the etching of first dielectric layer 210 may leave the top level of first dielectric layer 210 slightly above or below the top level of hard mask 121-123 and 125-126, which is normally acceptable.

Figures 5A, 5B:
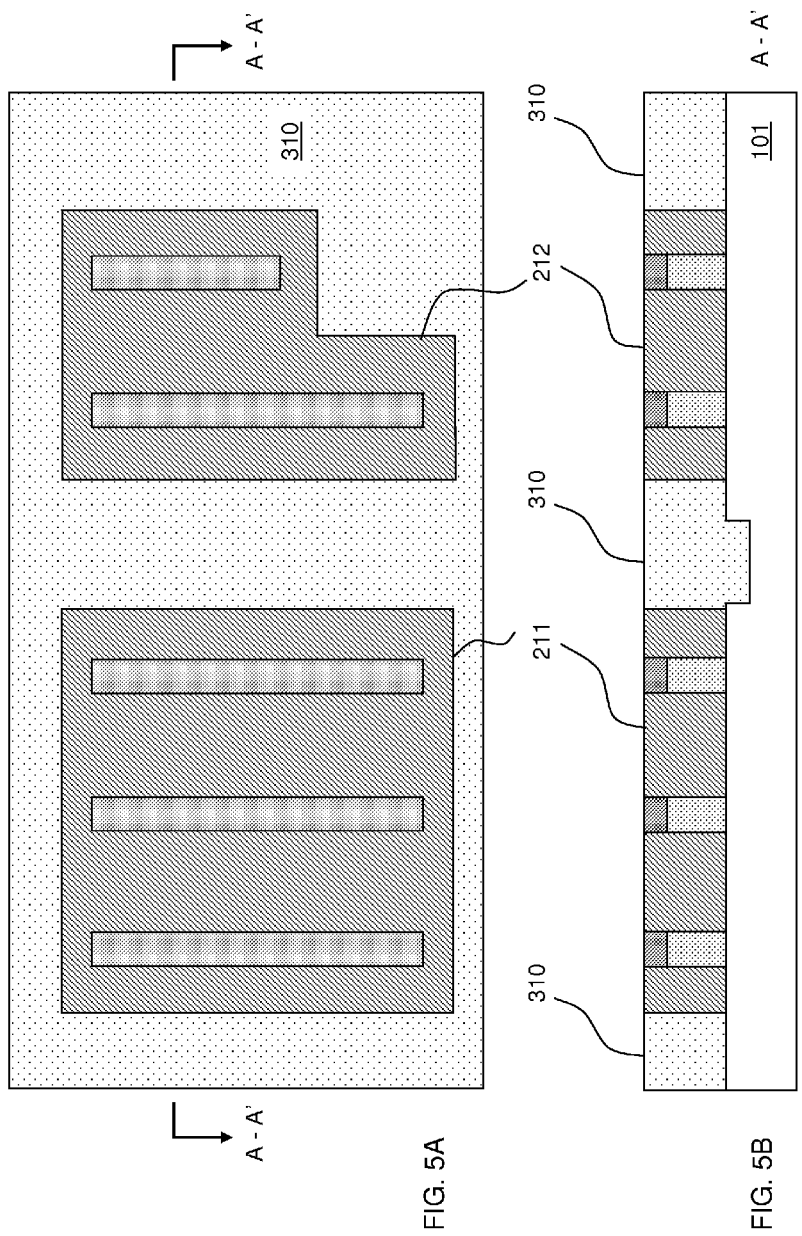
FIGS. 5A and 5B are demonstrative illustrations of top and cross-sectional views of a semiconductor structure during a process of manufacturing thereof, following a step illustrated in FIGS. 4A and 4B, according to an embodiment of present invention.

FIGS. 5A and 5B are demonstrative illustrations of top and cross-sectional views of a semiconductor structure during a process of manufacturing thereof, following a step illustrated in FIGS. 4A and 4B, according to an embodiment of present invention. More specifically, one embodiment of the method may include forming a second dielectric layer 310 that at least fills in areas that are defined for the insulating structure and maybe on top of areas of the first and second groups 141 and 142 of device features. For example, as being demonstratively illustrated in FIGS. 5A and 5B, the second dielectric layer 310 fills in areas that fully surround first group 141 of device features 111-113 and second group 142 of device features 115-116. In other words, the second dielectric layer 310 forms a structure that separates the first group 141 and the second group 142 of device features with two enclosures.

In one embodiment, the second dielectric layer 310 may be formed, through deposition, on top of substrate 101 and may have portions deposited on the top surfaces of the first group 141 and second group 142 of device features. The excess portions of the second dielectric layer 310 that are on top of device feature areas may be removed, for example, through a chemical-mechanic-polishing (CMP) process. The removal process may create a top surface of the second dielectric layer 310 that is coplanar with that of the hard masks 121-123 as well as 125-126. In other words, hard masks 121-123 and 125-126 may be used as etch-stop layer during the CMP process, which thin-down the second dielectric layer 310 to form an insulating structure.

According to one embodiment, material of the second dielectric layer 310 may be different from material of the first dielectric layer 210 such that a selective etching process may be applied to the first dielectric layer 210 relative to the second dielectric layer 310, or be applied to the second dielectric layer 310 relative to the first dielectric layer 210 during follow-up steps.

Figures 6A, 6B:
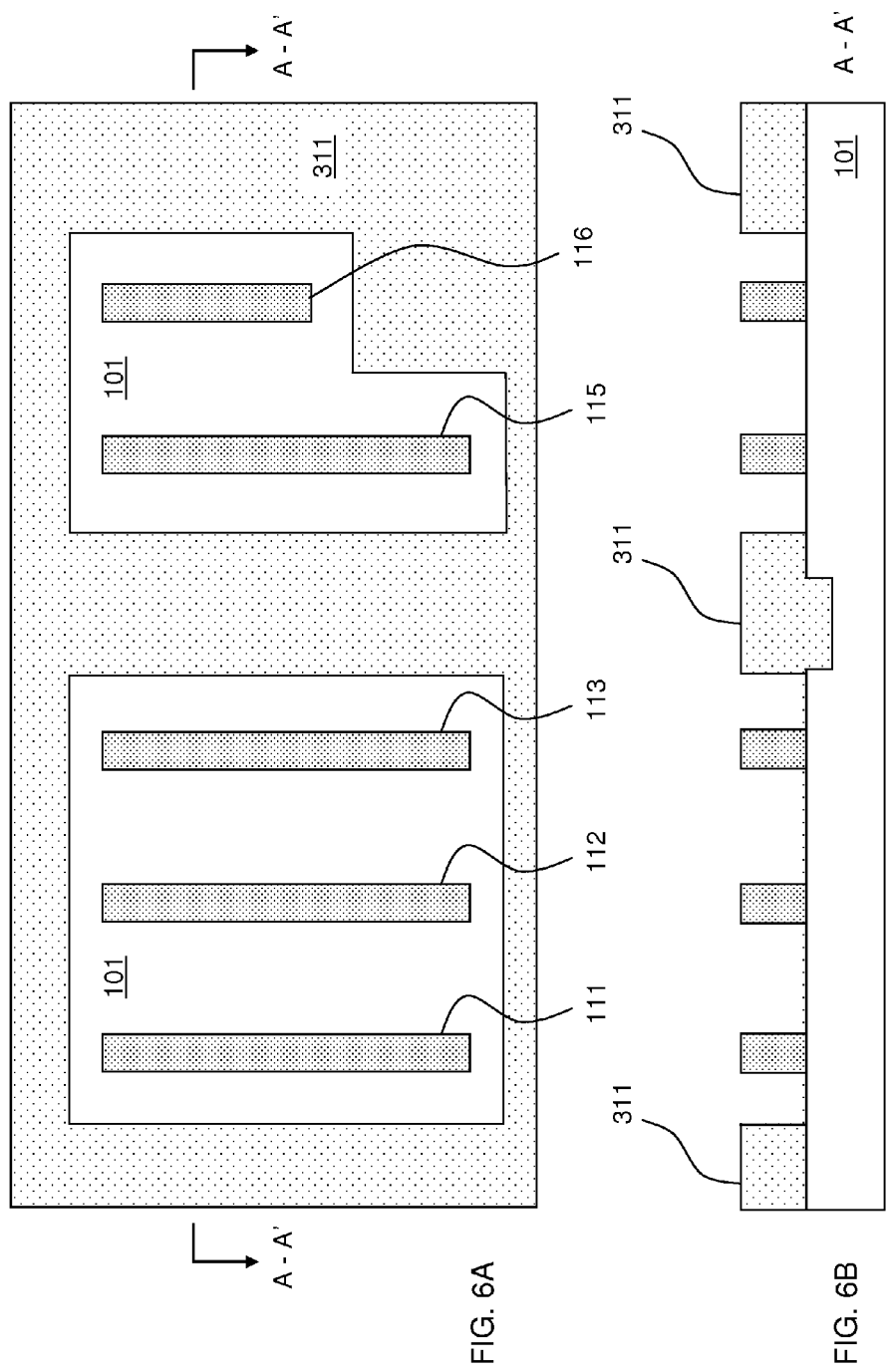
FIGS. 6A and 6B are demonstrative illustrations of top and cross-sectional views of a semiconductor structure during a process of manufacturing thereof, following a step illustrated in FIGS. 5A and 5B, according to an embodiment of present invention.

FIGS. 6A and 6B are demonstrative illustrations of top and cross-sectional views of a semiconductor structure during a process of manufacturing thereof, following a step illustrated in FIGS. 5A and 5B, according to an embodiment of present invention. According to one embodiment, the remaining portion of first dielectric layer 210, namely portion between and surrounding device features 111-113 and 115-116 in the areas 211 and 212, may be selectively removed such as etched away to expose first group 141 of device features 111-113 and second group 142 of device features 115-116. For example, in one embodiment the first and second groups 141 and 142 of device features may be fins that are formed to make fin-type field-effect-transistors (FinFETs), and the removal of the remaining portion of first dielectric layer 210 may expose top and sidewalls of fins 111-113 and 115-116. In the meantime, the remaining portions of the second dielectric layer 310 may become insulating structure 311, as being demonstratively illustrated in FIGS. 6A and 6B, surrounding first group 141 of fins 111-113 and second group 142 of fins 115-116. Hard masks 121-123 and 125-126 on top of fins 111-113 and 115-

116 may be selectively removed as well. For example, hard masks 121-123 and 125-126 may be removed first through a CMP process before the remaining portion of first dielectric layer 210 is removed.

FIGS. 7A and 7B are demonstrative illustrations of top and cross-sectional views of a semiconductor structure during a process of manufacturing thereof, following a step illustrated in FIGS. 6A and 6B, according to an embodiment of present invention. For example, a layer of gate dielectric (not shown) may first be formed to cover fins 111-113 and 115-116 and, on top thereof, one or more gate conductors may be formed. The gate dielectric and gate conductors on top thereof may collectively be referred to as gate structures, which may be made to be substantially perpendicular to one or more of the fins 111-113 and 115-116. For example, gate structures 411 and 413 may be formed across fins 111-113, and gate structures 412 and 414 may be formed across fins 115-116. More specifically, in order to form gate structures 411-414, a layer of gate dielectric material, such as silicon dioxide, silicon oxynitride, high-k dielectric or a combination thereof, and on top of the gate dielectric a layer of gate conductive material, such as polysilicon, may be formed to cover the areas of first and second groups of fins. Next, the layer of gate conductive material and the underneath layer of gate dielectric material (not shown) may be patterned, through for example a lithographic patterning and etching process, to form gate structures 411-414. In another embodiment, when a replacement gate process is used in forming the FinFETs, instead of the conductive material, other non-conductive materials may be used for the gate structures since the gate structures formed at this stage are dummy gate structures and may be replaced later with working conductive gate material.

According to one embodiment, as being demonstratively illustrated in FIGS. 7A and 7B, gate structures 411-414 may be horizontally formed crossing fins 111-113 and fins 115-116, and may have their two ends, at the left and the right, landing or being formed directly on top of insulating structure 311. According to another embodiment, the formation of gate structures 411-414 with ends being situated directly on top insulating structure 311 prevents source-drain shorting during epitaxial growth thereof because the epitaxial growth of source/drain is now constrained by the surrounding insulating structure 311. Next, as being demonstratively illustrated in FIGS. 7A and 7B, the formation of gate structures 411-414 may be followed by the formation of sidewall spacers 511-514 by currently existing or future developed technique, that surrounding gate structures 411-414. The sidewall spacers 511-514 provide proper spacing between later formed source/drain and the channel region of FinFET transistors.

Figure 8A:
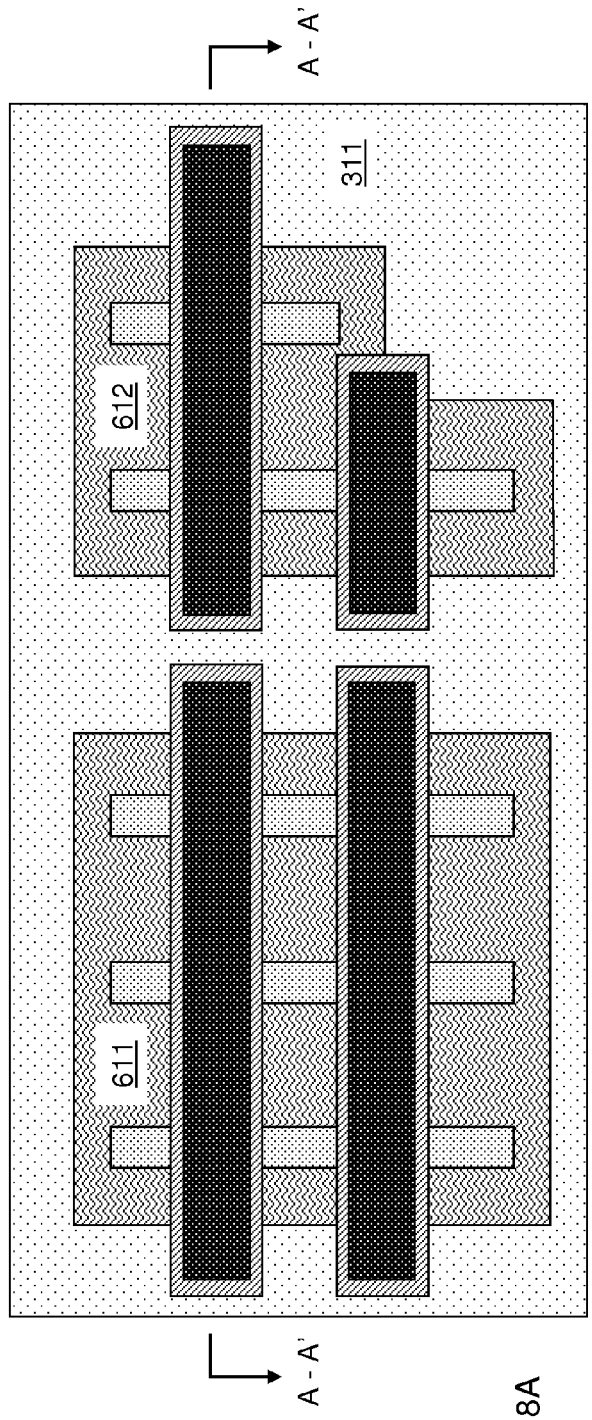
FIGS. 8A and 8B are demonstrative illustrations of top and cross-sectional views of a semiconductor structure during a process of manufacturing thereof, following a step illustrated in FIGS. 7A and 7B, according to an embodiment of present invention.
Figure 8B:
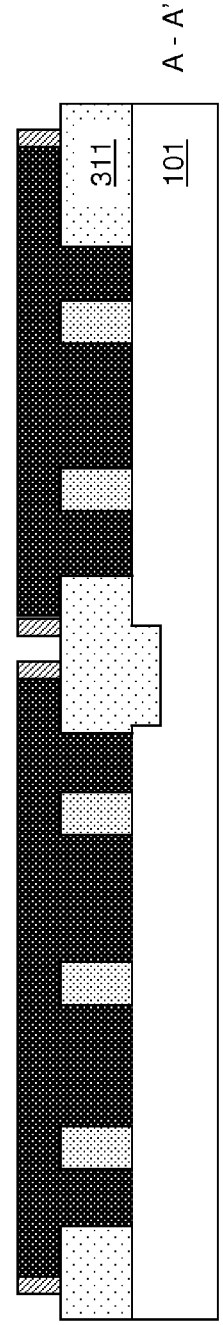

FIGS. 8A and 8B are demonstrative illustrations of top and cross-sectional views of a semiconductor structure during a process of manufacturing thereof, following a step illustrated in FIGS. 7A and 7B, according to an embodiment of present invention. More specifically, one embodiment of the method includes performing epitaxial growth of source and drain from substrate 101 in areas that are now defined by insulating structure 311. More specifically, epitaxial growth may be performed in area 211 of the first group 141 of fins to form source/drain 611 and in area 212 of the second group 142 of fins to form source/drain 612. In the meantime, no or no substantial epitaxially growth may be observed on top of the insulating structure 311 which ensures that no wrap-around will occur around end of the gate structures 411-414 to cause source/drain shorting, meaning shorting from one side (source or drain) to an opposite side (drain or source) of the gate structures.

FIGS. 9A and 9B are demonstrative illustrations of top and cross-sectional views of a semiconductor structure during a process of manufacturing thereof, following a step illustrated in FIGS. 3A and 3B, according to another embodiment of present invention. Here, reference is briefly made back to FIGS. 3A and 3B, where the first dielectric layer 210 is deposited conformally over first group 141 of device features 111-113 and second group 142 of device features 115-116. Next, instead of performing a directional etching of the first dielectric layer 210 to expose underneath substrate 101, one embodiment of the present invention includes depositing a second dielectric layer 710 directly on top of the first dielectric layer 210. Following the deposition, materials of the second dielectric layer 710 that are excessively deposited on top of area 721 of first group 141 of device features and on top of area 722 of second group 142 of device features may be removed, for example, through a chemical-mechanic-polishing (CMP) process and by applying selectivity in resistance to CMP polishing between first dielectric material 210 and second dielectric material 710. The CMP process may retain portions of the second dielectric layer 710, such as 711, to remain in areas where the first dielectric layer 210 has a lower level of height, which forms an upper portion of an insulating structure. In other words, the remaining portions 711 of the second dielectric layer 710 represent part of an insulating structure and resemble the height profile of the first dielectric layer 210.

FIGS. 10A and 10B are demonstrative illustrations of top and cross-sectional views of a semiconductor structure during a process of manufacturing thereof, following a step illustrated in FIGS. 9A and 9B, according to another embodiment of present invention. After the CMP process to remove portions of the second dielectric layer 710, one embodiment of present invention includes applying a directional etching process to remove portions of the first dielectric layer 210 that are not covered by the remaining portion 711 of the second dielectric layer 710. The remaining portion 711 and the portion 231 of the first dielectric layer 210 underneath thereof together form an insulating structure 811, as being demonstratively illustrated in FIG. 10B. As a result, the portions of first dielectric layer that are not part of the insulating structure may be etched away to expose both top and sidewalls of device features 111-113 and 115-116, which maybe for example fins for forming FinFETs. Because the etching process used is directional, the portion 231 of the first dielectric layer 210 that is underneath the remaining portions 711 of the second dielectric layer 710 may not be affected or at least not be significantly affected by the etching process, and may remain as part of the insulating structure 811. During the selective etching process in removing portions of the first dielectric layer 210, hard masks 121-123 and 125-126, which are on top of device features 111-113 and 115-116, may be removed as well.

Following the formation of insulating structure 811 as being illustrated in FIGS. 10A and 10B, similar process steps, such as those demonstratively illustrated in FIGS. 7A-7B and 8A-8B, may be performed to form gate structures and epitaxial source and drain for the FinFET devices. References may be made to FIGS. 7A and 7B, as well as to FIGS. 8A and 8B, respectively for more details.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
   forming a set of device features on top of a substrate, said set of device features including at least a first group of device features and a second group of device features;
   forming a first dielectric layer directly on top of said set of device features and on top of said substrate, thereby creating a height profile of said first dielectric layer measured from a top surface of said substrate, said height profile being associated with and creating a pattern of an insulating structure that fully surrounds said set of device features, said pattern of said insulating structure separating said first group of device features from said second group of device features in two enclosures; and
   forming a second dielectric layer in areas that are defined by said pattern to create said insulating structure,
   wherein forming said first dielectric layer comprises depositing a conformal dielectric layer on top of said first group and said second group of device features, said conformal dielectric layer having a thickness that is sufficiently thick to fill up any gap between any two neighboring said device features either within said first group or within said second group.

2. The method of claim 1, further comprising, before forming said second dielectric layer, removing a portion of said first dielectric layer to form sidewall spacers next to sidewalls of at least some of said set of device features and to expose portions of said substrate that are defined by said pattern of said insulating structure.

3. The method of claim 1, wherein forming said first dielectric layer comprises depositing a conformal dielectric layer as said first dielectric layer, whose thickness is less than half of a shortest distance between said first and said second groups of device features, creating said height profile that complements a height profile of said insulating structure.

4. The method of claim 1, further comprising, before forming said second dielectric layer, directionally etching said first dielectric layer to remove portions of said first dielectric layer that surround said first and second groups of device features to expose said substrate underneath thereof, said directional etching substantially maintains said pattern of said insulating structure.

5. The method of claim 4, further comprising, after forming said second dielectric layer in areas defined by said pattern directly on top of said exposed substrate, removing portions of said second dielectric layer that are deposited on top of said first dielectric layer and on top of said first and second groups of device features.

6. The method of claim 1, wherein said set of device features is a set of fins of a set of fin-type field-effect-transistors (FinFETs), further comprising forming a set of gates for said set of FinFETs substantially perpendicular to and across said set of fins, said set of gates having their respective two ends directly on top of said insulating structure.

7. The method of claim 6, further comprising epitaxially forming source and drain of said set of FinFETs from portions of said substrate adjacent to said set of fins.

8. A method comprising:
   forming a set of fin structures on top of a substrate, said set of fin structures being part of one or more fin-type field-effect-transistors (FinFETs);
   forming a first dielectric layer directly on top of said set of fin structures and on top of said substrate, said first dielectric layer having a height profile that is complement to a pattern of an insulating structure fully surrounding said set of fin structures;
   forming a second dielectric layer in areas defined by said pattern to create said insulating structure;
   forming a set of gates of said one or more FinFETs perpendicularly across said set of fin structures, having two ends of said set of gates landing directly on top of said insulating structure; and
   epitaxially forming source and drain of said one or more FinFETs from portions of said substrate adjacent to said set of fin structures.

9. The method of claim 8, wherein said set of fin structures includes at least a first group of fin structures and a second group of fin structures, and wherein forming said first dielectric layer comprises causing said first dielectric layer to create said pattern of said insulating structure by said height profile, said pattern of said insulating structure separating said first group of fin structures from said second groups of fin structures.

10. The method of claim 9, wherein forming said first dielectric layer comprises depositing a conformal dielectric layer to have a thickness, said thickness being more than half of a greatest distance between any two neighboring said fin structures either within said first group or within said second group and being less than half of a shortest distance between said first group of fin structures and said second group of fin structures, creating said height profile that complements a height profile of said insulating structure.

11. The method of claim 9, further comprising, before forming said second dielectric layer, directionally etching said first dielectric layer to remove portions of said first dielectric layer that surround said first and second groups of fin structures to expose said substrate underneath thereof, said directional etching substantially maintaining said pattern of said insulating structure.

12. The method of claim 11, further comprising, after forming said second dielectric layer in areas of said pattern directly on top of said exposed substrate, removing portions of said second dielectric layer that are deposited on top of said first dielectric layer and on top of said first and second groups of fin structures.

13. A method comprising:
   forming a set of device features on top of a substrate, said set of device features including at least a first group of device features and a second group of device features;
   forming a first dielectric layer directly on top of said set of device features and on top of said substrate, thereby creating a height profile of said first dielectric layer measured from a top surface of said substrate, said height profile being associated with and creating a pattern of an insulating structure that fully surrounds said set of device features, said pattern of said insulating structure separating said first group of device features from said second group of device features in two enclosures; and
   forming a second dielectric layer in areas that are defined by said pattern to create said insulating structure,
   wherein forming said first dielectric layer comprises depositing a conformal dielectric layer as said first dielectric layer, whose thickness is less than half of a shortest distance between said first and said second groups of device features, creating said height profile that complements a height profile of said insulating structure.

14. The method of claim 13, further comprising, before forming said second dielectric layer, removing a portion of said first dielectric layer to form sidewall spacers next to sidewalls of at least some of said set of device features and to expose portions of said substrate that are defined by said pattern of said insulating structure.

15. The method of claim 13, further comprising, before forming said second dielectric layer, directionally etching said first dielectric layer to remove portions of said first dielectric layer that surround said first and second groups of device features to expose said substrate underneath thereof, said directional etching substantially maintains said pattern of said insulating structure.

16. The method of claim 15, further comprising, after forming said second dielectric layer in areas defined by said pattern directly on top of said exposed substrate, removing portions of said second dielectric layer that are deposited on top of said first dielectric layer and on top of said first and second groups of device features.

* * * * *